United States Patent
Ishii et al.

(10) Patent No.: US 7,538,531 B2
(45) Date of Patent: May 26, 2009

(54) DRIVE CIRCUIT AND SWITCHING REGULATOR COMPRISING THE SAME

(75) Inventors: Takuya Ishii, Osaka (JP); Mikio Motomori, Osaka (JP)

(73) Assignee: Panasonic Corporation, Osaka (JP)

( * ) Notice: Subject to any disclaimer, the term of this patent is extended or adjusted under 35 U.S.C. 154(b) by 341 days.

(21) Appl. No.: 11/529,271

(22) Filed: Sep. 29, 2006

(65) Prior Publication Data
US 2007/0182390 A1 Aug. 9, 2007

(30) Foreign Application Priority Data
Feb. 7, 2006 (JP) .............................. 2006-029619

(51) Int. Cl.
*G05F 1/40* (2006.01)
(52) U.S. Cl. ....................................... 323/282
(58) Field of Classification Search ................. 323/265, 323/282, 283, 284, 351
See application file for complete search history.

(56) References Cited

U.S. PATENT DOCUMENTS

| 3,838,329 A | * | 9/1974 | Michelet et al. ................ 363/25 |
| 4,519,024 A | | 5/1985 | Federico et al. |
| 6,285,173 B1 | * | 9/2001 | Bentolila et al. ............. 323/282 |

FOREIGN PATENT DOCUMENTS

JP 2004-304527 A 10/2004

* cited by examiner

*Primary Examiner*—Adolf Berhane
(74) *Attorney, Agent, or Firm*—McDermott Will & Emery LLP

(57) ABSTRACT

A drive circuit drives a switch element having a first terminal, a second terminal, and a control terminal. A direct-current voltage is applied to the first terminal. The drive circuit includes a capacitor which is charged when the switch element is in the OFF state, and applies a charged voltage between the control terminal and the first terminal of the switch element or between the control terminal and the second terminal of the switch element when the switch element is in the ON state.

12 Claims, 5 Drawing Sheets

DRIVE CIRCUIT AND SWITCHING REGULATOR COMPRISING THE SAME

CROSS REFERENCE TO RELATED APPLICATIONS

This Non-provisional application claims priority under 35 U.S.C. §119(a) on Patent Application No. 2006-29619 filed in Japan on Feb. 7, 2006, the entire contents of which are hereby incorporated by reference.

BACKGROUND OF THE INVENTION

1. Field of the Invention

The present invention relates to a bootstrap drive circuit, and a switching regulator comprising the same for turning ON/OFF a high-side switch element.

2. Description of the Related Art

In recent years, switching regulators, which have highly efficient power conversion characteristics, are often used for power supply circuits which supply predetermined direct-current voltages to various electronic apparatuses. There are various switching regulators which are used, depending on the required characteristics. For example, FIG. 5A illustrates a circuit configuration of a step-down switching regulator as a first conventional example.

As illustrated in FIG. 5A, the conventional step-down switching regulator has: an input direct-current power supply 51 which supplies an input voltage Vi; a high-side switch 52 composed of an N-channel type MOS FET (metal-oxide-semiconductor field-effect transistor) having a drain connected to the positive terminal of the input direct-current power supply 51 and a gate connected to a high-side drive circuit 60; a low-side switch 53 composed of an N-channel type MOS FET having a drain connected to the source of the high-side switch 52, a gate connected to a low-side drive circuit 61, and a source connected to the ground; an inductor 54 which has one end connected to the source of the high-side switch 52 and the other end connected to an output terminal; an output capacitor 55 which has one end connected to the output terminal and the other end connected to the ground; a bootstrap capacitor 62 which has both terminals connected to the high-side drive circuit 60, and applies a bias voltage to the high-side drive circuit 60; and a bootstrap power supply 56 which is connected to the positive terminal of the bootstrap capacitor 62 via a forwardly connected diode 63, and supplies a drive voltage Vb as a bias voltage to the low-side drive circuit 61.

With this configuration, in the conventional step-down switching regulator, the high-side switch 52 and the low-side switch 53 are alternately switched to generate a pulse voltage, which is in turn smoothed by the inductor 54 and the output capacitor 55 to be output as an output voltage Vo. Here, the output voltage Vo and the input voltage Vi have a relationship represented by Vo=D×Vi, where D represents a duty ratio which is a proportion of an ON period of the high-side switch 52 with respect to one switching cycle. The output voltage Vo is detected and fed back by a control circuit, and is stabilized by adjusting the ON period of the high-side switch 52, though not illustrated.

When the high-side switch 52 is composed of an N-channel type MOS FET as in the first conventional example, a voltage higher than the input direct-current power supply Vi is required as a power supply voltage for the high-side drive circuit 60, so that the above-described bootstrap drive circuit is used. As illustrated in FIG. 5A, the high-side drive circuit 60 amplifies and outputs a high-side drive signal DH which has been biased by a voltage charged in the bootstrap capacitor 62 and has been input, thereby turning ON/OFF the high-side switch 52. Also, the low-side drive circuit 61 amplifies and outputs a low-side drive signal DL which has been biased by the drive voltage Vb from the bootstrap power supply 56 and has been input, thereby turning ON/OFF the low-side switch 53.

FIG. 5B is a timing chart of the high-side drive signal DH and the low-side drive signal DL. As illustrated in FIG. 5B, in order to avoid the high-side switch 52 and the low-side switch 53 from being simultaneously in the ON state, a high-level voltage and a low-level voltage are alternately repeated while simultaneously providing an inactive period during which a low level is provided. When the high-side drive signal DH is at the low level and the low-side drive signal DL is at the high level, the high-side switch 52 is in the OFF state and the low-side switch 53 is in the ON state. In this case, the source of the high-side switch 52 has a potential of 0, so that the bootstrap capacitor 62 is charged via the diode 63 by the bootstrap power supply 56.

Thus, when the bootstrap drive circuit is used, the bootstrap capacitor 62 needs to be charged by causing the low-side switch 53 to go to the ON state, so as to stably supply a bias voltage to the high-side drive circuit 60 which turns ON/OFF the high-side switch 52. However, when an electronic apparatus to which the switching regulator supplies the output voltage Vo is in the standby state (i.e., a light-load state), the ON period of the high-side switch 52 may be reduced, and the ON state period of the low-side switch 53 may also be limited so as to prevent backflowing of a current from the output terminal (an operation mode called a discontinuous operation).

Particularly, a load in the standby state tends to be considerably light as compared to that in the operating state, so as to support recent trends to energy conservation. In such an extremely light load state, a period during which both the high-side switch 52 and the low-side switch 53 are in the OFF state occupies a most portion of the switching cycle. In addition, in order to reduce switching loss, the switching cycle may be increased, or the operation itself of the switching regulator is suspended for a predetermined period (intermittent operation). During the light load state, the extremely light load state, or the intermittent operation, the ON state period of the low-side switch 53 is short, or the frequency of the ON state is low, so that the bootstrap capacitor 62 is not sufficiently charged, leading to a problem that a bias voltage can no longer be stably supplied to the high-side drive circuit 60.

As a second conventional example which includes a drive circuit for solving such a problem, there is a circuit described in, for example, JP 2004-304527 A (see FIG. 6).

The circuit of FIG. 6 includes, in addition to the components of FIG. 5A: a charge pump drive circuit 64; a first switch element 65 composed of an N-channel type MOS FET and a second switch element 66 composed of a P-channel type MOS FET which are alternately driven ON/OFF by the charge pump drive circuit 64; a first diode 67 having an anode connected to the low-side drive circuit 61; a flying capacitor 68 having a positive terminal connected to the cathode of the diode 67 and a negative terminal connected to the common drain of the first switch element 65 and the second switch element 66; and a second diode 69 having an anode connected to the positive terminal of the flying capacitor 68 and a cathode connected to the positive terminal of the bootstrap capacitor 62.

The second switch element 66 is connected between the source of the high-side switch 52 and the drain of the first switch element 65. Therefore, when the first switch element 65 is in the ON state and the second switch element 66 is in the OFF state, the flying capacitor 68 is charged by the bootstrap power supply 56 via the first diode 67. On the other hand, when the first switch element 65 is in the OFF state and the second switch element 66 is in the ON state, the bootstrap capacitor 62 is charged by the flying capacitor 68 via the second diode 69.

With the above-described configuration, in the step-down switching regulator of the second conventional example, by the switching operations of the first switch element 65 and the second switch element 66, the bootstrap capacitor 62 is charged via the flying capacitor 68 by the bootstrap power supply 56. Therefore, the bootstrap capacitor 62 can stably supply a bias voltage to the high-side drive circuit 60, irrespective of the ON/OFF states of the high-side switch 52 and the low-side switch 53.

However, the drive circuit included in the switching regulator of the second conventional example needs to include the flying capacitor 68 in addition to the bootstrap capacitor 62. In general, a capacitor has a larger area than that of a MOS FET or the like included in a switch element, and therefore, by adding another capacitor to a drive circuit, the sizes of the drive circuit and the switching regulator are increased.

SUMMARY OF THE INVENTION

In view of the above-described problem, an object of the present invention is to secure a drive voltage of a high-side switch even during a light-load operation without adding another capacitor to a bootstrap drive circuit.

To achieve the object, the present invention provides a circuit for driving a switch element, in which a capacitor for driving the switch element is charged when the switch element is in the OFF state.

Specifically, a drive circuit is provided for driving a switch element having a first terminal, a second terminal, and a control terminal, in which a direct-current voltage is applied to the first terminal. The drive circuit comprises a capacitor which is charged when the switch element is in the OFF state, and applies a charged voltage between the control terminal and the first terminal of the switch element or between the control terminal and the second terminal of the switch element when the switch element is in the ON state.

According to the drive circuit of the present invention, since the capacitor is charged when the switch element is in the OFF state, a drive voltage for a switch element can be secured even in a light or extremely light load operation in which the switch element is in the OFF state for a long time. As a result, a stable operation can be achieved even in the case of an extremely light load without providing a capacitor other than the capacitor for charging and supplying a voltage for driving the switch element.

The drive circuit of the present invention preferably comprises a direct-current power supply, a first switch which is connected between a positive terminal of the capacitor and a positive terminal of the direct-current power supply, and goes to the ON state when the switch element is turned OFF, a second switch which is connected between a negative terminal of the capacitor and a negative terminal of the direct-current power supply, and goes to the ON state when the switch element is turned OFF, a third switch which is connected between the positive terminal of the capacitor and the control terminal of the switch element, and goes to the ON state when the switch element is turned ON, and a fourth switch which is connected to the negative terminal of the capacitor and the second or first terminal of the switch element, and goes to the ON state when the switch element is turned ON.

Thereby, the capacitor can be reliably charged when the switch element is in the OFF state.

When the first switch is further provided, the first switch is preferably a diode having a cathode connected to the positive terminal of the capacitor.

Also, in this case, preferably, when the first switch is in the ON state, the third switch is in the OFF state, and when the third switch is in the ON state, the first switch is in the OFF state. Thereby, it is possible to avoid the adjacent switches from being simultaneously in the ON state, thereby making it possible to prevent occurrence of a through current.

Also, preferably, when the second switch is in the ON state, the fourth switch is in the OFF state, and when the fourth switch is in the ON state, the second switch is in the OFF state. Thereby, it is possible to avoid the adjacent switches from being simultaneously in the ON state, thereby making it possible to prevent occurrence of a through current.

In the drive circuit of the present invention, the switch element is preferably an N-channel FET. When an N-channel FET, which has a small size and low loss, is used as a high-side switch instead of a P-channel FET, a drive voltage for the high-side switch can be more reliably secured even in an extremely light load operation.

A switching regulator according to the present invention comprises the drive circuit of the present invention, a switch element driven by the drive circuit, an input direct-current power supply for applying a direct-current voltage to a first terminal of the switch element, and an inductor connected to a second terminal of the switch element, for repeatedly performing accumulation and discharge of electric energy by an ON/OFF operation of the switch element. The drive circuit rectifies and smoothes a voltage occurring in the inductor to generate a direct-current output voltage.

According to the switching regulator of the present invention, since the drive circuit of the present invention is provided, a stable operation can be achieved even in the case of an extremely light load without providing a capacitor other than the capacitor for charging and supplying a voltage for driving the switch element.

As described above, according to the drive circuit of the present invention and the switching regulator employing the drive circuit, a drive voltage for a switch element can be secured even in a light or extremely light load operation in which the switch element is in the OFF state for a long time, without adding another capacitor to a bootstrap drive circuit, resulting in a stable operation.

DETAILED DESCRIPTION OF THE PREFERRED EMBODIMENTS

First Embodiment

Hereinafter, a first embodiment of the present invention will be described with reference to the accompanying drawings.

Figure 1A:
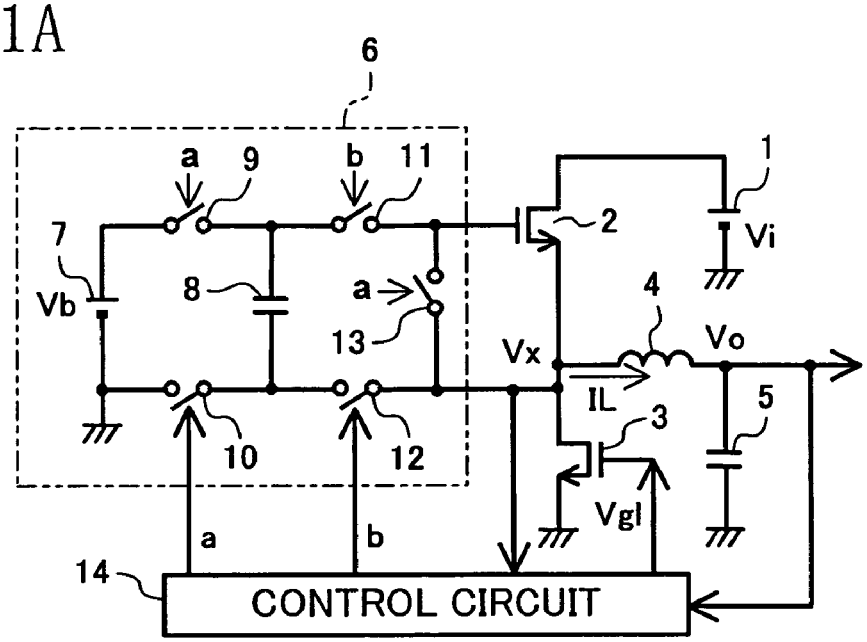
FIG. 1A is a diagram illustrating a circuit configuration of a drive circuit according to a first embodiment of the present invention and a switching regulator including the drive circuit.
Figure 1B:
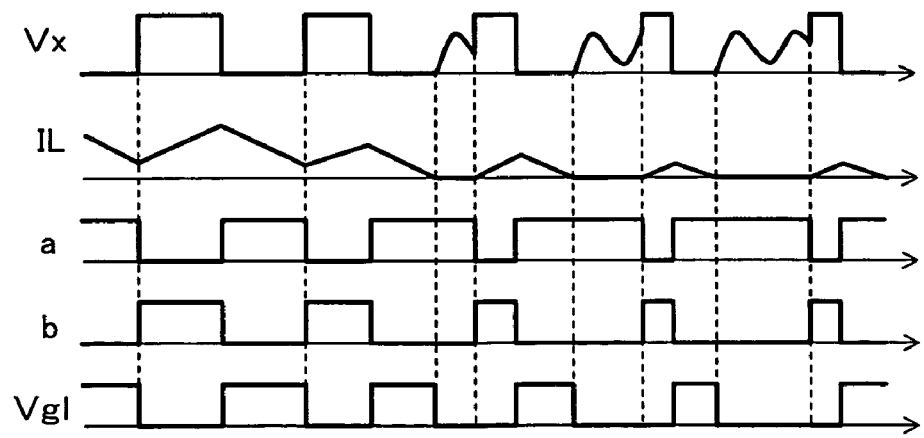
FIG. 1B is a timing diagram illustrating operating waveforms of the switching regulator of the first embodiment of the present invention.

FIG. 1A illustrates a circuit configuration of a drive circuit according to the first embodiment of the present invention and a switching regulator including the drive circuit. FIG. 1B illustrates operating waveforms of major portions of the switching regulator.

As illustrated in FIG. 1A, the switching regulator of the first embodiment comprises: an input direct-current power supply 1 for supplying an input voltage Vi; a high-side switch 2 composed of a first N-channel type MOS FET having a drain connected to the positive terminal of the input direct-current power supply 1; a low-side switch 3 composed of a second N-channel type MOS FET having a drain connected to the source of the high-side switch 2, a gate at which a gate voltage Vgl is received, and a source connected to the ground; an inductor 4 having one end connected to a connection point of the source of the high-side switch 2 and the drain of the low-side switch 3, and the other end connected to an output terminal; an output capacitor 5 having a positive terminal connected to the output terminal and a negative terminal connected to the ground; a drive circuit 6 for outputting a drive signal to the gate of the high-side switch 2, and receiving a switching voltage Vx which is a voltage at the connection point between the high-side switch 2 and the low-side switch 3; and a control circuit 14 for receiving the output voltage Vo and the switching voltage Vx, and outputting the gate voltage Vgl to the gate of the low-side switch 3, and a first control signal a and a second control signal b complementary to the first control signal a to the drive circuit 6.

With this configuration, a pulse voltage (the switching voltage Vx) generated by alternately switching the high-side switch 2 and the low-side switch 3 is smoothed by the inductor 4 and the output capacitor 5 to be output as the output voltage Vo. Here, a current flowing through the inductor 4 is referred to as an inductor current IL.

The drive circuit 6 has a bootstrap power supply 7 for supplying the drive voltage Vb for driving the high-side switch 2, a bootstrap capacitor 8, a first switch 9, a second switch 10, a third switch 11, a fourth switch 12, and a fifth switch 13.

The first switch 9 is connected between the positive terminal of the bootstrap capacitor 8 and the bootstrap power supply 7. The second switch 10 is connected between the negative terminal of the bootstrap capacitor 8 and a ground terminal. The third switch 11 is connected between the positive terminal of the bootstrap capacitor 8 and the gate of the high-side switch 2. The fourth switch 12 is connected between the negative terminal of the bootstrap capacitor 8 and the source (connection point) of the high-side switch 2. The fifth switch 13 is connected between the gate and the source of the high-side switch 2. Here, the first switch 9, the second switch 10, and the fifth switch 13 are turned ON/OFF by the first control signal a, and the third switch 11 and the fourth switch 12 are turned ON/OFF by the second control signal b.

The control circuit 14 detects the output voltage Vo, and in order to stabilize the detected output voltage Vo, outputs the first control signal a, the second control signal b, and the gate voltage Vgl. The second control signal b has a predetermined switching cycle. The width of an H (high) level pulse of the second control signal b is reduced when the output voltage Vo is becoming higher than a target value, and conversely, is broadened when the output voltage Vo is becoming lower than the target value. The first control signal a goes from an L (low) level to the H level after the second control signal b goes to the L level, and goes to the L level before the second control signal b goes to the H level.

The gate voltage Vgl is in synchronization with the first control signal a. The control circuit 14 detects a voltage drop during conduction of the low-side switch 3 from the switching voltage Vx. When the current of the low-side switch 3 becomes 0, the gate voltage Vgl is caused to be the L level even if the first control signal a is at the H level. In other words, the low-side switch 3 functions as a synchronous rectifier circuit through which a current does not backflow. As such a synchronous rectifier circuit through which a current does not backflow, a circuit which compares voltages at both ends of a switch and drives the switch based on the result of the comparison, can be used (see, for example, U.S. Pat. No. 4,519,024).

FIG. 1B illustrates an operating waveform of each of the switching voltage Vx, the inductor current IL, the first control signal a, the second control signal b, and the gate voltage Vgl when a load current of the switching regulator is reduced over time.

Hereinafter, an operation of the switching regulator of the first embodiment of the present invention will be described with reference to FIGS. 1A and 1B.

Firstly, an operation of the switching regulator when the load current of the switching regulator is sufficiently large and the inductor current IL increases or decreases in the range of 0 or more, will be described.

The control circuit 14 causes the first control signal a and the second control signal b to alternately go to the H level, and causes the gate voltage Vgl which is to be applied to the low-side switch 3 to be in synchronization with the first control signal a. Here, it is assumed that the first control signal a and the second control signal b are alternately switched to the H level, i.e., they are complementary logic signals. An inactive period (dead time) during which the first control signal a and the second control signal b are both caused to go to the L level when the signal levels are switched, is desirably provided so that the first switch 9 and the third switch 11 do not simultaneously go to the ON state, and that the second switch 10 and the fourth switch 12 do not simultaneously go to the ON state.

During a period when the first control signal a is at the L level and the second control signal b is at the H level, the first switch 9, the second switch 10, and the fifth switch 13 are in the OFF state, and the third switch 11 and the fourth switch 12 are in the ON state, so that a voltage charged in the bootstrap capacitor 8 is applied between the gate and the source of the high-side switch 2, which in turn goes to the ON state. On the other hand, during this period, since the gate voltage Vgl is at the L level, the low-side switch 3 is in the OFF state. Therefore, during this period, a difference voltage (Vi−Vo) between the input voltage Vi and the output voltage Vo is applied to the inductor 4, so that the inductor current IL is increased and electric energy is accumulated in the inductor 4.

Next, during a period when the first control signal a is at the H level and the second control signal b is at the L level, the first switch 9 and the second switch 10 are in the ON state, and the third switch 11 and the fourth switch 12 are in the OFF state, so that the bootstrap capacitor 8 is charged to the voltage Vb of the bootstrap power supply 7. In addition, during this period, since the fifth switch 13 is in the ON state, the gate-source potential of the high-side switch 2 is 0, so that the high-side switch 2 is in the OFF state. Also, during this period, since the gate voltage Vgl is at the H level, the low-side switch 3 is in the ON state. Therefore, during this period, an output voltage (−Vo) is applied the inductor 4 in a reverse direction, so that the inductor current IL is reduced and the electric energy of the inductor 4 is discharged.

Thus, by repeatedly performing the switching operation using the first control signal a and the second control signal b which are complementary to each other, the output voltage Vo is supplied to a load. The output voltage Vo is represented by Vo=D×Vi, where D represents a duty ratio which is a proportion of the high-side switch 2 with respect to one switching cycle. As described above, the control circuit 14 detects the output voltage Vo, and outputs each of the control signals a and b while adjusting the duty ratio D so as to stabilize the voltage value of the output voltage Vo.

Next, an operation of the switching regulator when the load current of the switching regulator is small, so that the inductor current IL reaches zero, will be described.

Firstly, during a period when the first control signal a is at the L level and the second control signal b is at the H level, the third switch 11 and the fourth switch 12 are in the ON state, and the first switch 9, the second switch 10, and the fifth switch 13 are in the OFF state, so that the voltage of the bootstrap capacitor 8 is applied between the gate and the source of the high-side switch 2, which in turn goes to the ON state. On the other hand, since the gate voltage Vgl is at the L level, the low-side switch 3 is in the OFF state. During this period, the difference voltage (Vi−Vo) between the input voltage Vi and the output voltage Vo is applied to the inductor 4, so that the inductor current IL is increased and electric energy is accumulated in the inductor 4.

Next, during a period when the first control signal a is at the H level and the second control signal b is at the L level, the first switch 9 and the second switch 10 are in the ON state, and the third switch 11 and the fourth switch 12 are in the OFF state, so that the bootstrap capacitor 8 is charged to the voltage Vb of the bootstrap power supply 7. During this period, since the fifth switch 13 is in the ON state, the high-side switch 2 is in the OFF state. Also, since the gate voltage Vgl is at the H level, the low-side switch 3 is in the ON state. Thereby, an output voltage (−Vo) is applied to the inductor 4 in a reverse direction, so that the inductor current IL is reduced and electric energy is discharged from the inductor 4. Here, when the current amount of the inductor current IL reaches 0, the gate voltage Vgl goes to the L level, so that the low-side switch 3 goes to the OFF state. In this case, since the high-side switch 2 remains in the OFF state, the potential at one end of the inductor 4, i.e., the potential of the switching voltage Vx at the connection point with the source of the high-side switch 2, is not fixed. Therefore, the switching voltage Vx has a vibrating waveform which increases or decreases around the output voltage Vo as a center due to a resonance phenomenon caused by the inductance and the floating capacitance of the inductor 4. On the other hand, there is not a change in the H level of the first control signal a and the L level of the second control signal b, so that the bootstrap capacitor 8 is charged to the voltage Vb of the bootstrap power supply 7.

By repeatedly performing the above-described switching operation, the output voltage Vo is supplied to a load. As illustrated in FIG. 1B, when the load current of the switching regulator is further reduced so that substantially no load is present (extremely light load), the ON time of the low-side switch 3 as well as the ON time of the high-side switch 2 are reduced. In addition, since the period during which both the high-side switch 2 and the low-side switch 3 are in the OFF state is increased, the output voltage Vo of the switching regulator of the first embodiment is stabilized.

In the case of a drive circuit in which the bootstrap capacitor 62 is charged during the ON time of the low-side switch 53 as in the first conventional example, a charging period is not secured in such an extremely light load operation.

In contrast to this, according to the drive circuit of the first embodiment, since the bootstrap capacitor 8 is charged during the OFF period of the high-side switch 2, but not during the ON period of the low-side switch 3, the drive voltage of the high-side switch 2 can be sufficiently secured.

Second Embodiment

Hereinafter, a second embodiment of the present invention will be described with reference to the drawings.

Figure 2:
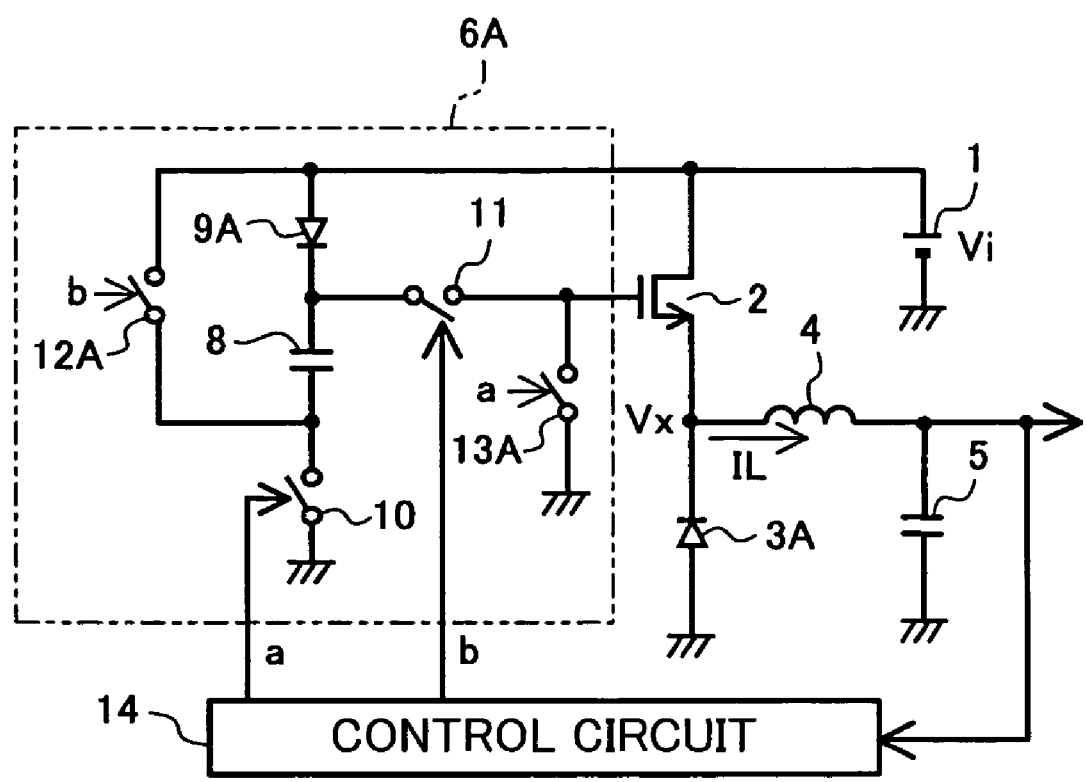
FIG. 2 is a diagram illustrating a circuit configuration of a drive circuit according to a second embodiment of the present invention and a switching regulator including the drive circuit.

FIG. 2 illustrates a circuit configuration of a drive circuit according to the second embodiment of the present invention and a switching regulator including the drive circuit. In FIG. 2, the same components as those of FIG. 1A are indicated by the same reference numerals and will not be described.

As illustrated in FIG. 2, the switching regulator of the second embodiment is different from the first embodiment in that a first diode 3A is used instead of the low-side switch 3 composed of a MOS FET, and in the configuration of the drive circuit 6A.

The first diode 3A has an anode connected to the ground and a cathode connected to the source of the high-side switch 2. Therefore, the gate voltage Vgl of the control circuit 14 is not supplied to the first diode 3A.

Hereinafter, differences between the drive circuit 6A and the drive circuit 6 will be described.

Firstly, the bootstrap power supply 7 which supplies the drive voltage Vb is eliminated, and the input direct-current power supply 1 also serves as a drive voltage supply.

As the first switch 9, a second diode 9A having an anode connected to the positive terminal of the input direct-current power supply 1 and a cathode connected to the positive terminal of the bootstrap capacitor 8 and the gate of the high-side switch 2, is used.

The connection position of the fourth switch 12 is changed from between the negative terminal of the bootstrap capacitor 8 and the source of the high-side switch 2, to between the negative terminal of the bootstrap capacitor 8 and the drain of the high-side switch 2. The resultant fourth switch 12 is indicated by 12A.

The connection position of the fifth switch 13 is changed from between the gate and the source of the high-side switch 2 to between the gate of the high-side switch 2 to a ground terminal. The resultant fifth switch 13 is indicated by 13A.

The drive circuit 6A of the second embodiment having the above-described configuration operates in a manner similar to that of the drive circuit 6 of the first embodiment.

This is because, if the input voltage Vi can be used as a gate drive voltage for an N-channel type MOS FET included in the high-side switch 2, the input direct-current power supply 1 can also serve as a direct-current power supply for supplying the drive voltage Vb.

Also, if a voltage drop from the input voltage Vi or the drive voltage Vb in the forward direction of the diode, can be used as the gate drive voltage for the N-channel type MOS FET, the second diode 9A can be used instead of the first switch 9.

Note that the fourth switch 12A may be connected between the negative terminal of the bootstrap capacitor 8 and the source of the high-side switch 2 as in the drive circuit 6 of FIG. 1A, instead of the configuration in which the fourth switch 12A is connected between the negative terminal of the bootstrap capacitor 8 and the drain of the high-side switch 2 as illustrated in FIG. 2.

Also, as illustrated in FIG. 2, the fifth switch 13A which switches OFF the high-side switch 2 during conduction can be connected between the gate of the high-side switch 2 and the ground terminal if the withstand voltage is higher than the sum of the input voltage Vi and the drive voltage Vb.

Also, in the switching regulator of the second embodiment, the first diode 3A is used instead of a synchronous rectifier circuit. This is because the drive circuit 6A of this embodiment does not require the low-side switch 3 so as to charge the bootstrap capacitor 8, and uses the control signals a and b from the control circuit 14 to charge the bootstrap capacitor 8 during the OFF period of the high-side switch 2.

In the conventional art, the low-side switch 53 (i.e., a synchronous rectifier circuit) is required to charge the bootstrap capacitor 62, so that the low-side switch 53 needs to go to the ON state during booting. In the drive circuit 6A of this embodiment and the switching regulator including the drive circuit 6A, the synchronous rectifier circuit itself is not required.

Third Embodiment

Hereinafter, a third embodiment of the present invention will be described with reference to the drawings.

Figure 3A:
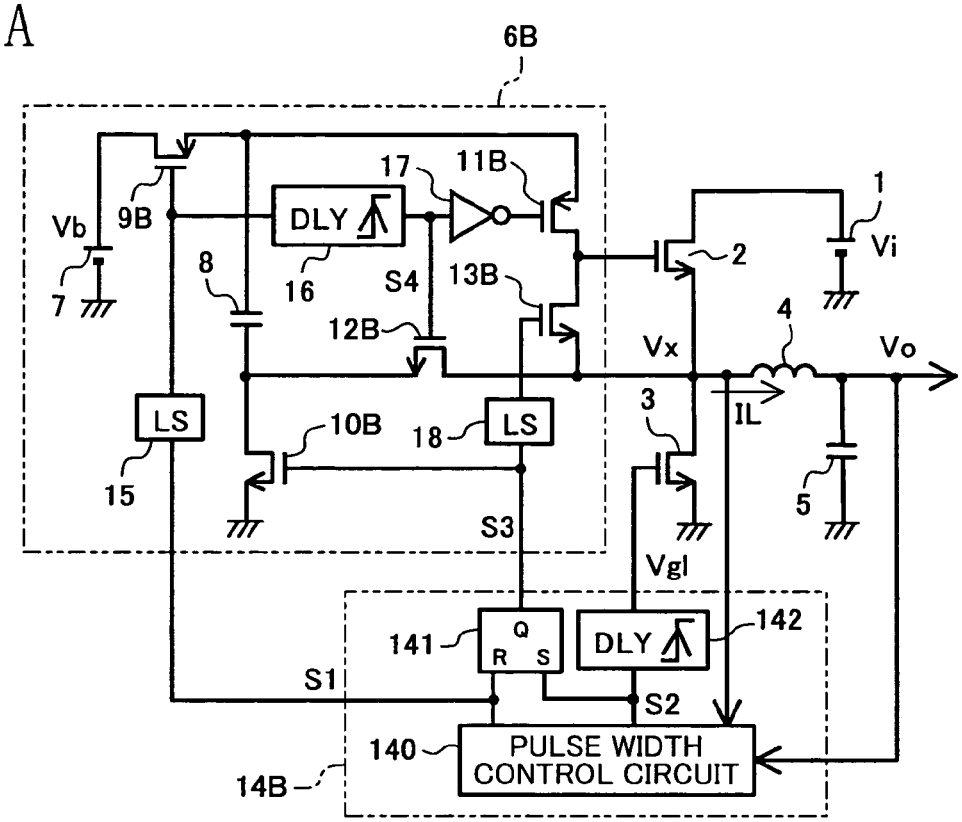
FIG. 3A is a diagram illustrating a circuit configuration of a drive circuit according to a third embodiment of the present invention and a switching regulator including the drive circuit.
Figure 3B:
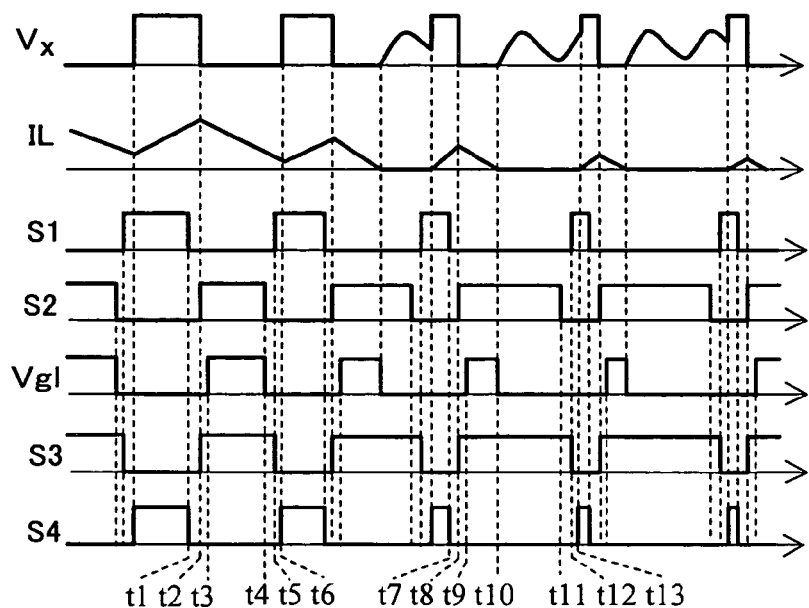
FIG. 3B is a timing diagram illustrating operating waveforms of the switching regulator of the third embodiment of the present invention.

FIG. 3A illustrates a circuit configuration of a drive circuit according to the third embodiment of the present invention and a switching regulator including the drive circuit. FIG. 3B illustrates operating waveforms of major portions of the switching regulator. In FIG. 3A, the same components as those of FIG. 1A are indicated by the same reference numerals and will not be described.

As illustrated in FIG. 3A, the switching regulator of the third embodiment is different from that of the first embodiment in the configuration of a drive circuit 6B and the configuration of a control circuit 14B.

The control circuit 14B detects the output voltage Vo, and in order to stabilize the detected output voltage Vo, has a pulse-width control circuit 140 which outputs a first control signal S1, a second control signal S2, and a gate voltage Vgl.

The first control signal S1 has a predetermined switching cycle. The width of an H (high) level pulse of the first control signal S1 is reduced when the output voltage Vo is becoming higher than a target value, and conversely, is broadened when the output voltage Vo is becoming lower than the target value. The gate voltage Vgl is a pulse signal complementary to the first control signal S1. When a voltage drop during conduction of the low-side switch 3 from the switching voltage Vx is detected and a current flowing through the low-side switch 3 becomes 0, the gate voltage Vgl is caused to go to the L level even if the first control signal S1 is at the L level. In other words, the low-side switch 3 functions as a synchronous rectifier circuit through which a current does not backflow.

Note that an inactive period (dead time) during which the first control signal S1 and the gate voltage Vgl are both caused to go to the L level when the signal levels are switched, is provided so that the first control signal S1 and the gate voltage Vgl do not simultaneously go to the ON state. The third embodiment is a specific example in which the dead time is implemented in the first embodiment.

Also, the control circuit 14B has an RS latch 141 which has a set terminal S which receives the second control signal S2, and a reset terminal R which receives the first control signal S1, and outputs a third control signal S3, and a first delay circuit 142 which receives the second control signal S2, and delays only a rising edge of the received signal by a predetermined time to generate the gate voltage Vgl.

The drive circuit 6B has: a first switch 9B composed of a P-channel type MOS FET having a drain connected to the bootstrap power supply 7 and a source connected to the positive terminal of the bootstrap capacitor 8; a second switch 10B composed of an N-channel type MOS FET having a gate which receives the third control signal S3, a drain connected to the negative terminal of the bootstrap capacitor 8, and a source connected to the ground; a third switch 11B composed of a P-channel type MOS FET having a source connected to the positive terminal of the bootstrap capacitor 8, and a drain connected to the gate of the high-side switch 2; a fourth switch 12B composed of an N-channel type MOS FET having a drain connected to the source of the high-side switch 2, and a source connected to the negative terminal of the bootstrap capacitor 8; and a fifth switch 13B composed of an N-channel type MOS FET having a drain connected to the gate of the high-side switch 2, and a source connected to the source of the high-side switch 2.

The drive circuit 6B has: a first level shift circuit 15 which receives the first control signal S1, and applies a level-shifted drive voltage to the gate of the first switch 9B; a second delay circuit 16 which receives the first control signal S1 from the first level shift circuit 15, generates a fourth control signal S4 obtained by delaying only a rising edge of the first control signal S1 by a predetermined time, and applying the fourth control signal S4 to the gate of the fourth switch 12B; an inverter 17 which inverts the fourth control signal S4 and applies the inverted fourth control signal S4 to the gate of the third switch 11B; and a second level shift circuit 18 which receives the third control signal S3, and applies a level-shifted drive voltage to the gate of a fifth switch 13B.

FIG. 3B illustrates operating waveforms of the switching voltage Vx, the inductor current IL, the first control signal S1, the second control signal S2, the gate voltage Vgl, the third control signal S3, and the fourth control signal S4 when a load current of the switching regulator is reduced over time.

Hereinafter, an operation of the switching regulator of the third embodiment of the present invention will be described with reference to FIGS. 3A and 3B.

Firstly, an operation of the switching regulator when the load current of the switching regulator is sufficiently large and the inductor current IL increases or decreases in the range of 0 or more, will be described.

The control circuit 14B causes the first control signal S1 and the gate voltage Vgl to alternately go to the H level while providing a dead time. During a period when the first control signal S1 and the fourth control signal S4 are at the H level, and the second control signal S2 and the gate voltage Vgl are at the L level, the RS latch 141 is in the reset state, so that the third control signal S3 is at the L level. Therefore, the first switch 9B which receives the first control signal S1 at the gate and the second switch 10B and the fifth switch 13B which receive the third control signal S3 at the gate, are in the OFF state. Also, the third switch 11B which receives an inverted signal of the fourth control signal S4 at the gate and the fourth switch 12B which receives the fourth control signal S4 at the gate are in the ON state. Thereby, a voltage of the bootstrap capacitor 8 is applied between the gate and the source of the high-side switch 2, so that the high-side switch 2 goes to the ON state, while the low-side switch 3 goes to the OFF state. In this case, the difference voltage (Vi−Vo) between the input voltage Vi and the output voltage Vo is applied to the inductor 4, so that the inductor current IL is increased and electric energy is accumulated in the inductor 4.

Next, at time t1 of FIG. 3B, when the first control signal S1 goes to the L level, the first switch 9B is turned ON, and also, the fourth control signal S4 simultaneously goes to the L level, so that the third switch 11B and the fourth switch 12B are turned OFF. Following this, at time t2 delayed by the dead time, when the second control signal S2 goes to the H level, the RS latch 141 is set, so that the third control signal S3 goes to the H level. When the third control signal S3 goes to the H level, the second switch 10B and the fifth switch 13B are turned ON. When the fifth switch 13B is turned ON, the gate-source potential of the high-side switch 2 becomes 0, so that the high-side switch 2 is turned OFF, and as a result, the switching voltage Vx is reduced. When the switching voltage Vx becomes lower than the ground potential, the inductor current IL flows from the ground terminal via a body diode (not shown) parasitic to the low-side switch 3, so that the switching voltage Vx is turned into a decrease. Following this, at time t3 after a delay time possessed by the first delay circuit 142, the gate voltage Vgl rises, so that the low-side switch 3 is turned ON. As a result, the inductor current IL flows via the low-side switch 3 thus turned ON. Also, during a period when the high-side switch 2 is turned OFF, i.e., a period when the first switch 9B which receives the L-level first control signal S1 at the gate and the second switch 10B which receives the H-level third control signal S3 at the gate are both in the ON state, the bootstrap capacitor 8 is charged to the voltage Vb of the bootstrap power supply 7.

Next, at time t4 of FIG. 3B, when the second control signal S2 goes to the L level, the gate voltage Vgl also goes to the L level, so that the inductor current IL flows again via the body diode of the low-side switch 3. Following this, at time t5 delayed by the dead time, when the first control signal S1 goes to the H level, the first switch 9B is turned ON, and at the same time, the RS latch 141 is reset, the third control signal S3 goes to the L level. When the third control signal S3 goes to the L level, the second switch 10B and the fifth switch 13B are turned OFF. Further, at time t6 after a delay time possessed by the second delay circuit 16, the fourth control signal S4 also goes to the H level, so that the third switch 11B and the fourth switch 12B are turned ON. Therefore, when the third switch 11B is turned ON, the high-side switch 2 is turned ON, so that the switching voltage Vx is increased to the input voltage Vi. Thereby, the difference voltage (Vi−Vo) between the input voltage Vi and the output voltage Vo is applied to the inductor 4, so that the inductor current IL is turned into an increase.

By repeatedly performing the above-described switching operation, the output voltage Vo is supplied to a load.

Next, an operation of the switching regulator when the load current of the switching regulator is small and the inductor current IL reaches 0, will be described.

Initially, during a period when the first control signal S1 and the fourth control signal S4 are at the H level, and the second control signal S2 and the gate voltage Vgl are at the L level, the RS latch 141 is in the reset state, so that the third control signal S3 is at the L level. During this period, the first switch 9B, the second switch 10B, and the fifth switch 13B are in the OFF state, while the third switch 11B and the fourth switch 12B are in the ON state. In this case, the voltage of the bootstrap capacitor 8 is applied between the gate and the source of the high-side switch 2, which in turn goes to the ON state, so that the low-side switch 3 goes to the OFF state. Thereby, the difference voltage (Vi−Vo) between the input voltage Vi and the output voltage Vo is applied to the inductor 4, the inductor current IL is increased and electric energy is accumulated in the inductor 4.

Next, operations at time t7 to t9 of FIG. 3B are similar to those at time t1 to t3 and will not be described.

Next, at time t10 of FIG. 3B, when the inductor current IL reaches 0, the gate voltage Vgl goes to the L level, and the low-side switch 3 goes to the OFF state. Since the high-side switch 2 also remains in the OFF state, the potential at one end of the inductor 4, i.e., the potential of the switching voltage Vx at the connection point with the source of the high-side switch 2, is not fixed. Therefore, the switching voltage Vx has a vibrating waveform which increases or decreases around the output voltage Vo as a center due to a resonance phenomenon caused by the inductance and the floating capacitance of the inductor 4. On the other hand, the first control signal S1 remains at the L level, and due to the RS latch 141, the H level of the third control signal S3 is not changed, the first switch 9B and the second switch 10B are kept in the ON state. As a result, the bootstrap capacitor 8 is charged to the voltage Vb of the bootstrap power supply 7.

Figure 4:
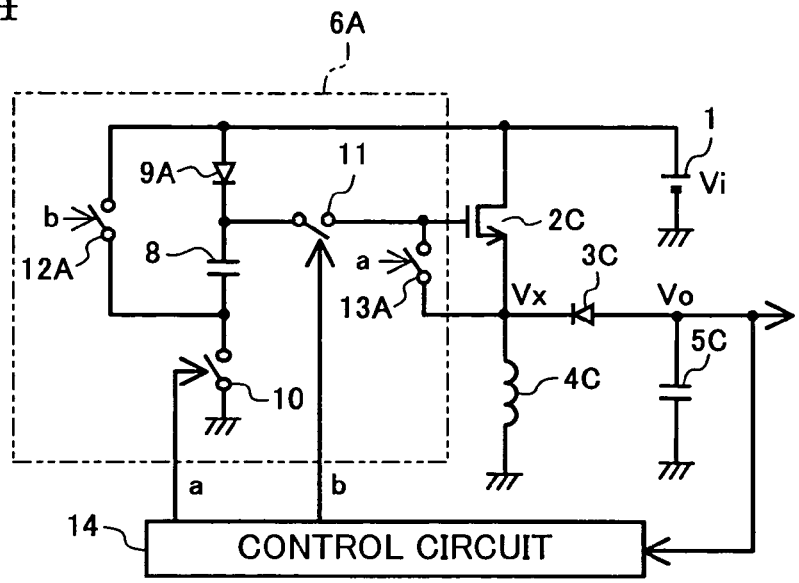
FIG. 4 is a circuit diagram illustrating a variation of the switching regulator of the second embodiment of the present invention.
Figure 5A:
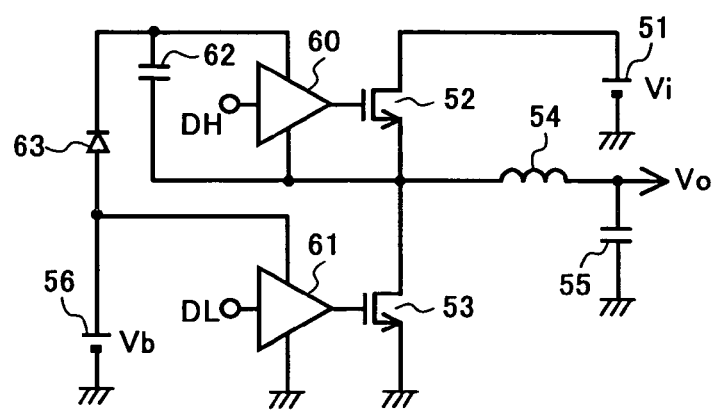
FIG. 5A is a diagram illustrating a circuit configuration of a drive circuit according to a first conventional example and a switching regulator including the drive circuit.
Figure 5B:
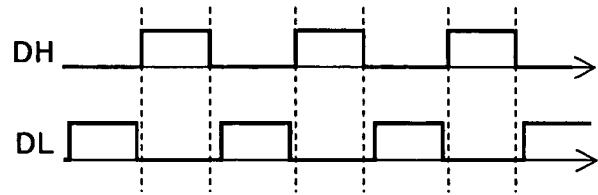
FIG. 5B is a timing diagram illustrating operating waveforms of the switching regulator of the first conventional example.
Figure 6:
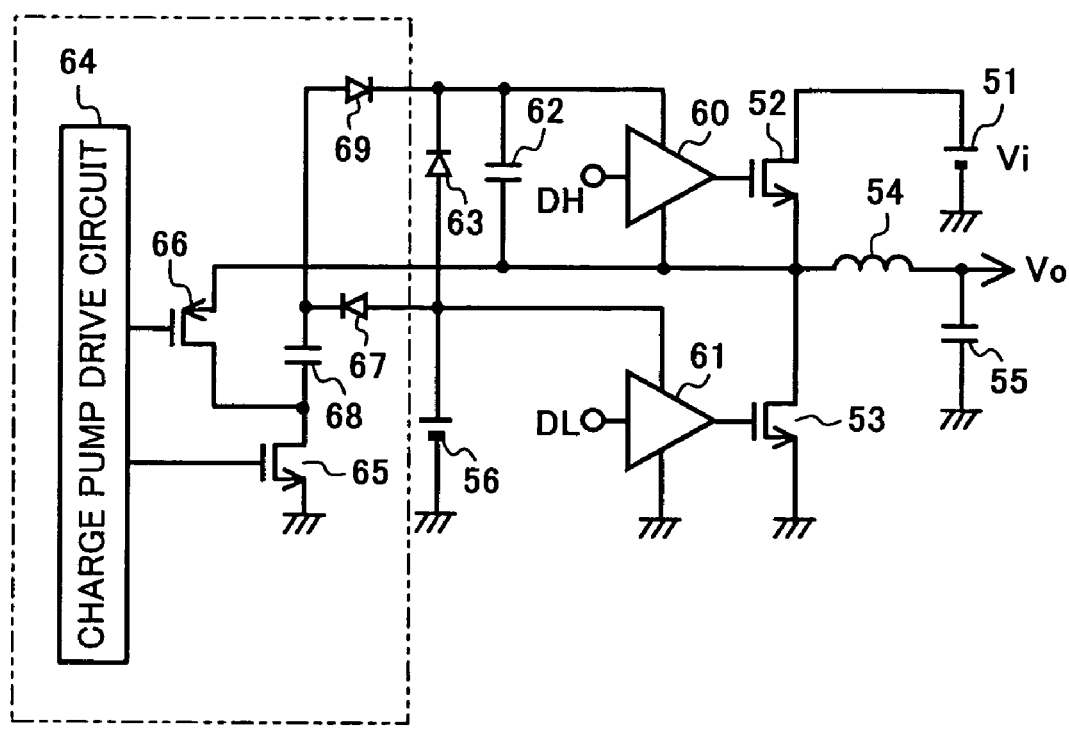
FIG. 6 is a diagram illustrating a circuit configuration of a drive circuit according to a second conventional example and a switching regulator including the drive circuit.

Operations at time t11 to t13 of FIG. 4 are similar to those at time t4 to t6 and will not be described.

By repeatedly performing the above-described switching operation, the output voltage Vo is supplied to a load. When the load current of the switching regulator is further reduced so that substantially no load is present (extremely light load), the ON time of the low-side switch 3 as well as the ON time of the high-side switch 2 are reduced. In addition, since the period during which both the high-side switch 2 and the low-side switch 3 are in the OFF state is increased, the output voltage Vo of the switching regulator of the third embodiment is stabilized.

In the case of a drive circuit in which the bootstrap capacitor 62 is charged during the ON time of the low-side switch 53 as in the first conventional example, a charging period is not secured in such an extremely light load operation.

In contrast to this, according to the drive circuit of the third embodiment, since the bootstrap capacitor 8 is charged during the OFF period of the high-side switch 2, but not during the ON period of the low-side switch 3, the drive voltage of the high-side switch 2 can be sufficiently secured.

Although the drive circuit of the third embodiment and the switching regulator including the drive circuit have been described as a step-down switching regulator which employs a synchronous rectifier circuit, the low-side switch 3 may be the first diode 3A of the second embodiment.

Although the drive circuit of each of the first to third embodiments and the switching regulators including the drive circuit have been described using a step-down switching regulator, the present invention is not limited to this. For example, the present invention can be applied to an inverting switching regulator as a variation of the second embodiment as illustrated in FIG. 4.

The inverting switching regulator of FIG. 4 can generate the output voltage Vo whose polarity is reverse to that of the input voltage Vi. Here, a configuration in which the drain of a switch element 2C is connected to the input direct-current power supply 1 which supplies the input voltage Vi is similar to that of each of the first to third embodiments. In addition, one end of an inductor 4C is connected to the source of the source of a high-side switch 2C and the cathode of a first diode 3C, and the other end thereof is connected to the ground terminal. One end of an output capacitor 5C is connected to the anode of the first diode 3C and the output terminal.

In other words, the present invention is applicable when a potential higher than the input voltage Vi is required to drive the switch element 2 connected to the input direct-current power supply 1 as in the step-down switching regulator or the inverting switching regulator.

As described above, the present invention is useful for a bootstrap drive circuit, a power supply circuit for supplying a direct-current voltage to various electronic apparatuses, and the like.

What is claimed is:

1. A drive circuit for driving a first switch having a first terminal, a second terminal, and a control terminal, wherein a direct-current voltage from a first direct-current power supply is applied to the first terminal, the drive circuit comprising:
    a capacitor which is charged when the first switch is in the OFF state, and applies a charged voltage between the control terminal and the second terminal of the first switch when the first switch is in the ON state;
    a second direct-current power supply;
    a second switch which is connected between a positive terminal of the capacitor and a positive terminal of the second direct-current power supply, and goes to the ON state when the first switch is turned OFF;
    a third switch which is connected between a negative terminal of the capacitor and a negative terminal of the second direct-current power supply, and goes to the ON state when the first switch is turned OFF;
    a fourth switch which is connected between the positive terminal of the capacitor and the control terminal of the first switch, and goes to the ON state when the first switch is turned ON; and
    a fifth switch which is connected to the negative terminal of the capacitor and the second terminal of the first switch, and goes to the ON state when the first switch is turned ON.

2. The drive circuit of claim 1, wherein the second switch comprises a diode having a cathode connected to the positive terminal of the capacitor.

3. The drive circuit of claim 1, wherein, when the second switch is in the ON state, the fourth switch is in the OFF state, and when the fourth switch is in the ON state, the second switch is in the OFF state.

4. The drive circuit of claim 1, wherein, when the third switch is in the ON state, the fifth switch is in the OFF state, and when the fifth switch is in the ON state, the third switch is in the OFF state.

5. A drive circuit for driving a first switch having a first terminal, a second terminal, and a control terminal, wherein a direct-current voltage from a first direct-current power supply is applied to the first terminal, the drive circuit comprising:
    a capacitor which is charged when the first switch is in the OFF state, and applies a charged voltage between the control terminal and the first terminal of the first switch when the first switch is in the ON state;
    a second direct-current power supply;
    a second switch which is connected between a positive terminal of the capacitor and a positive terminal of the second direct-current power supply, and goes to the ON state when the first switch is turned OFF;
    a third switch which is connected between a negative terminal of the capacitor and a negative terminal of the second direct-current power supply, and goes to the ON state when the first switch is turned OFF;
    a fourth switch which is connected between the positive terminal of the capacitor and the control terminal of the first switch, and goes to the ON state when the first switch is turned ON; and
    a fifth switch which is connected to the negative terminal of the capacitor and the first terminal of the first switch, and goes to the ON state when the first switch is turned ON.

6. The drive circuit of claim 5, wherein the second switch comprises a diode having a cathode connected to the positive terminal of the capacitor.

7. The drive circuit of claim 5, wherein, when the second switch is in the ON state, the fourth switch is in the OFF state, and when the fourth switch is in the ON state, the second switch is in the OFF state.

8. The drive circuit of claim 5, wherein, when the third switch is in the ON state, the fifth switch is in the OFF state, and when the fifth switch is in the ON state, the third switch is in the OFF state.

9. The drive circuit of claim 5, wherein the first switch is an N-channel FET.

10. A switching regulator comprising:
    a drive circuit;
    a first switch driven by the drive circuit;
    a first direct-current power supply for applying a direct-current voltage to a first terminal of the first switch;
    an inductor connected to a second terminal of the first switch, for repeatedly performing accumulation and discharge of energy by an ON/OFF operation of the first switch;
    a rectify and smooth circuit which rectifies and smoothes a voltage occurring in the inductor to generate a direct-current output voltage;
    a second direct-current power supply;
    a second switch which is connected between a positive terminal of the capacitor and a positive terminal of the second direct-current power supply, and goes to the ON state when the first switch is turned OFF;
    a third switch which is connected between a negative terminal of the capacitor and a negative terminal of the second direct-current power supply, and goes to the ON state when the first switch is turned OFF;
    a fourth switch which is connected between the positive terminal of the capacitor and the control terminal of the first switch, and goes to the ON state when the first switch is turned ON; and
    a fifth switch which is connected to the negative terminal of the capacitor and the second terminal of the first switch, and goes to the ON state when the first switch is turned ON,
    wherein the drive circuit drives the first switch having the first terminal, the second terminal, and a control terminal, wherein a direct-current voltage from the first direct-current power supply is applied to the first terminal, and
    the drive circuit has a capacitor which is charged when the first switch is in the OFF state, and applies a charged voltage between the control terminal and the second terminal of the first switch when the first switch is in the ON state.

11. A switching regulator comprising:
    a drive circuit;
    a first switch driven by the drive circuit;
    a first direct-current power supply for applying a direct-current voltage to a first terminal of the first switch;

an inductor connected to a second terminal of the first switch, for repeatedly performing accumulation and discharge of energy by an ON/OFF operation of the first switch;

a rectify and smooth circuit which rectifies and smoothes a voltage occurring in the inductor to generate a direct-current output voltage;

a second direct-current power supply;

a second switch which is connected between a positive terminal of the capacitor and a positive terminal of the second direct-current power supply, and goes to the ON state when the first switch is turned OFF;

a third switch which is connected between a negative terminal of the capacitor and a negative terminal of the second direct-current power supply, and goes to the ON state when the first switch is turned OFF;

a fourth switch which is connected between the positive terminal of the capacitor and the control terminal of the first switch, and goes to the ON state when the first switch is turned ON; and a fifth switch which is connected to the negative terminal of the capacitor and the first terminal of the first switch, and goes to the ON state when the first switch is turned ON, wherein the drive circuit drives the first switch having the first terminal, the second terminal, and a control terminal, wherein a direct-current voltage from the first direct-current power supply is applied to the first terminal, and the drive circuit has a capacitor which is charged when the first switch is in the OFF state, and applies a charged voltage between the control terminal and the first terminal of the first switch when the first switch is in the ON state.

12. The drive circuit of claim 1, wherein the first switch is an N-channel FET.

* * * * *